United States Patent
Li et al.

(10) Patent No.: US 7,421,607 B2
(45) Date of Patent: *Sep. 2, 2008

(54) METHOD AND APPARATUS FOR PROVIDING SYMMETRICAL OUTPUT DATA FOR A DOUBLE DATA RATE DRAM

(75) Inventors: Wen Li, Boise, ID (US); Aaron Schoenfeld, Boise, ID (US); R. Jacob Baker, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/751,182

(22) Filed: May 21, 2007

(65) Prior Publication Data

US 2007/0220295 A1    Sep. 20, 2007

Related U.S. Application Data

(63) Continuation of application No. 10/759,077, filed on Jan. 20, 2004, now Pat. No. 7,237,136, which is a continuation of application No. 09/653,409, filed on Aug. 31, 2000, now Pat. No. 6,704,881.

(51) Int. Cl.
*G06F 13/42* (2006.01)

(52) U.S. Cl. .............. 713/401; 713/400; 713/500; 713/501; 713/502; 713/503; 713/600; 713/601; 326/93; 327/141; 327/263

(58) Field of Classification Search .......... 713/400, 713/401, 500–503, 600, 601; 326/93; 327/141, 327/263
See application file for complete search history.

(56) References Cited

U.S. PATENT DOCUMENTS

| | | | |
|---|---|---|---|
| 4,682,343 A | | 7/1987 | Pfiffner |
| 5,341,405 A | * | 8/1994 | Mallard, Jr. ............ 375/376 |
| 5,422,835 A | | 6/1995 | Houle et al. |
| 5,467,464 A | | 11/1995 | Oprescu et al. |
| 5,535,187 A | | 7/1996 | Melas et al. |
| 5,614,845 A | | 3/1997 | Masleid |
| 5,668,982 A | * | 9/1997 | Davis ..................... 713/600 |
| 5,734,685 A | | 3/1998 | Bedell et al. |

(Continued)

OTHER PUBLICATIONS

Wen Li et al., "Method and Apparatus for Output Data Synchronization With System Clock in DDR," filed Jun. 1, 2000.

*Primary Examiner*—Abdelmoniem Elamin
(74) *Attorney, Agent, or Firm*—Dickstein Shapiro LLP

(57) ABSTRACT

An apparatus and method is disclosed to compensate for skew and asymmetry of a locally processed system clock used to synchronize an output signal, e.g., a data signal or a timing signal, from a logic circuit, for example a memory device. A first phase detector, array of delay lock loop (DLL) delay elements and accompanying circuitry are disclosed to phase-lock the rising edge of the output signal with the rising edge of the system clock XCLK signal. Additionally, a comparator circuit, a register delay, an array of DLL delay elements and accompanying circuitry are disclosed to add or subtract delay from the falling edge of the DQ signal in order to produce a symmetrical output of the DQ signal.

17 Claims, 9 Drawing Sheets

U.S. PATENT DOCUMENTS

| | | | |
|---|---|---|---|
| 5,818,895 A * | 10/1998 | Oh ............................. 377/118 |
| 5,841,580 A | 11/1998 | Farmwald et al. |
| 5,886,582 A * | 3/1999 | Stansell ...................... 331/1 A |
| 5,914,996 A | 6/1999 | Huang |
| 5,917,760 A | 6/1999 | Millar |
| 5,953,263 A | 9/1999 | Farmwald et al. |
| 5,964,880 A | 10/1999 | Liu et al. |
| 5,969,551 A | 10/1999 | Fujioka |
| 6,002,281 A | 12/1999 | Jones et al. |
| 6,016,282 A | 1/2000 | Keeth |
| 6,023,436 A * | 2/2000 | Han ......................... 365/203 |
| 6,031,402 A | 2/2000 | Wang et al. |
| 6,035,365 A | 3/2000 | Farmwald et al. |
| 6,038,195 A | 3/2000 | Farmwald et al. |
| 6,044,032 A | 3/2000 | Li |
| 6,067,592 A | 5/2000 | Farmwald et al. |
| 6,088,602 A * | 7/2000 | Banister ...................... 455/574 |
| 6,101,152 A | 8/2000 | Farmwald et al. |
| 6,111,447 A * | 8/2000 | Ternullo, Jr. ................. 327/292 |
| 6,212,126 B1 | 4/2001 | Sakamoto |
| 6,212,359 B1 * | 4/2001 | Knox .......................... 725/135 |
| 6,249,168 B1 * | 6/2001 | Cairns et al. ................. 327/295 |
| 6,580,706 B1 * | 6/2003 | Silvestre et al. ............. 370/350 |
| 6,646,968 B1 | 11/2003 | Miyaoka |
| 6,704,881 B1 * | 3/2004 | Li et al. ...................... 713/401 |
| 7,028,208 B2 | 4/2006 | Johnson et al. |
| 7,237,136 B2 * | 6/2007 | Li et al. ...................... 713/401 |

* cited by examiner

METHOD AND APPARATUS FOR PROVIDING SYMMETRICAL OUTPUT DATA FOR A DOUBLE DATA RATE DRAM

This application is a continuation of application Ser. No. 10/759,077, filed Jan. 20, 2004, now U.S. Pat. No. 7,237,136, which is a continuation of application Ser. No. 09/653,409, filed Aug. 31, 2000, now U.S. Pat. No. 6,704,881, which are hereby incorporated by reference in their entireties.

FIELD OF THE INVENTION

The present invention relates generally to synchronizing the timing of data transfer with a system clock using a delay lock loop circuit. More particularly, the present invention relates to a method and apparatus for producing a symmetrical data clock by adding to or subtracting compensating delays to the falling edge of an internal clock.

BACKGROUND OF THE INVENTION

Modern high-speed integrated circuit devices, such as synchronous dynamic random access memories (SDRAM), microprocessors, etc., rely upon clock signals to control the flow of commands, data, addresses, etc., into, through, and out of the devices. Additionally, new types of circuit architectures such as SLDRAM require individual circuits to work in unison even though such circuits may individually operate at different speeds. As a result, the ability to synchronize the operation of a circuit through the generation of local clock signals has become increasingly more important. Conventionally, data transfer operations are initiated at the edges of the local clock signals (i.e., transitions from high to low or low to high).

In synchronous systems, integrated circuits are synchronized to a common reference system clock. This synchronization often cannot be achieved simply by distributing a single system clock to each of the integrated circuits for the following reason, among others. When an integrated circuit receives a system clock, the circuit often must condition the system clock before the circuit can use the clock. For example, the circuit may buffer the incoming system clock or may convert the incoming system clock from one voltage level to another. This processing introduces its own delay and/or skew, with the result that the locally processed system clock, often will no longer be adequately synchronized with the incoming system clock. In addition, the system clock itself may have a certain amount of skew within a tolerance set by system specifications. For example, an exemplary DDR SDRAM system may allow a system clock skewed to have a duty cycle of 55%/45%. The trend towards faster system clock speeds further aggravates this problem since faster clock speeds reduce the amount of delay, or clock skew, which can be tolerated.

To remedy this problem, an additional circuit is conventionally used to synchronize the locally processed clock to the system clock. Two common circuits which are used for this purpose are the phase-locked loop (PLL) and the delay-locked loop (DLL). In the phase-locked loop (PLL), a voltage-controlled oscillator produces the local clock. The phases of the local clock and the system clock are compared by a phase-frequency detector, with the resulting error signal used to drive the voltage-controlled oscillator via a loop filter. The feedback via the loop filter phase locks the local clock to the system clock.

In contrast, the delay-locked loop (DLL) generates a synchronized local clock by delaying the incoming system clock by an integer number of periods. More specifically, the buffers, voltage level converters, etc. of the integrated circuit device, for example the input buffers of an SDRAM memory device, introduce a certain amount of delay. The delay-locked loop (DLL) then introduces an additional amount of delay such that the resulting local clock is synchronous with the incoming system clock.

In certain synchronous circuit devices, for example double data rate (DDR) dynamic random access memory (DRAM), wherein operations are initiated on both the rising and the falling edges of the clock signals, it is known to employ a delay lock loop (DLL) to synchronize the output data with the system clock (XCLK) using a phase detector. In an exemplary case, the transition of the data signal is perfectly aligned with the rising or falling edge of the XCLK. The time from the rising or falling edge of the data clock to the time when the data is available on the output data bus (tAC) is within specifications. A phase detector is conventionally used to lock the rising edge of the output data signal from the DLL (DQ) to the rising edge of the XCLK. Since the rising edge of the DQ signal is phase-locked to the rising edge of the XCLK signal, the rising edge of data being output from the device is synchronized with the system clock XCLK.

FIG. 1 depicts a DDR DRAM data synchronizing circuit using a DLL as is presently contemplated in the art. A DQ data output signal from an array is input to output buffer 23 and has its timing adjusted to be synchronized with the XCLK signal 8. At system initialization, a phase detector 2 is activated by an initialization signal 4. The phase detector 2 compares the phase of the CLKIN signal 6, a processed signal derived from the XCLK signal 8, with the OUT_MDL signal 10, a model of the data output signal DQ. The phase detector 2 then adjusts the DLL delay elements 12 using respective ShiftR 14 and ShiftL 16 signals, to respectively decrease or increase the time delay added to the CLKIN signal 6 with respect to the OUT_MDL signal 10.

The Output Buffer Model 19 models the delays generated by the Output Buffer 23 and the CLK Buffer Model 21 models the delays generated by the Input Buffer 7 to produce an OUT_MDL signal 10 such that alignment of the OUT_MDL signal 10 with the CLKIN signal 6 will result in alignment of the XCLK signal 8 with the DQ data output signal 24. By adjusting the delay of the CLKIN signal 6 through the DLL delay elements 12, the phase detector 2 can align the rising edge of the DQ output signal 24 with the rising edge of the XCLK signal 8.

The output data signal DQ 24 is provided to a data pad 31 and is synchronized with the system clock XCLK 8.

In addition, the FIG. 1 circuit can also be used to adjust an output toggle clock signal DQS as shown in FIG. 9. In this case, an additional output buffer 23a is used to generate the DQS signal at pad 31a. The DQS signal can be used for timing purposes, such as a data strobe signal. For purposes of simplifying the discussion below, the background discussion and the discussion of the invention will be described in the context of synchronizing the data output signal DQ with the system clock XCLK 8, but the discussions herein apply to also synchronizing a DQS signal with the system clock XCLK.

FIG. 2 is a timing diagram for the synchronizing circuitry of FIG. 1. As shown in FIG. 2, the rising edge 26 of the XCLK signal 9, which is carried on the XCLK signal line 8 of FIG. 1, is aligned with the rising edge 28 of the DQ signal 25, which is carried on the DQ signal line 24 of FIG. 1. As is indicated by the arrows shown in FIG. 2, the rising edge 30 of the DLLCLK signal 33 (carried on the DLLCLK signal line 32 of FIG. 1) initiates the rise and fall of the DLLR signal 21 (carried on the DLLR signal line 20 of FIG. 1), through the Rise Fall CLK Generator 18 (FIG. 1), which in turn initiates the rising edge 28 of the DQ signal 25. Likewise, the rising edge 34 of the DLLCLK* signal 37 (carried on the DLLCLK* signal line 36) initiates the rise and fall of the DLLF signal 23 (carried on the DLLF signal line 22 of FIG. 1) which in turn initiates the falling edge 42 of the DQ signal 25. For proper data synchronization, the rising edges of the XCLK 9 and DQ 25 should be aligned within an allowed tolerance and the duty cycle of the data output timing signal DQ 25 should be within the specifications for the system in which the synchronizing circuitry will be used.

Unfortunately, however, not all synchronizing circuitry components are ideal or even exemplary. Non-symmetrical delays can be created by the input processing of the system clock including input buffering of the system clock signal using the buffer 7. The system clock itself may exhibit an asymmetric duty cycle, for example, up to a 55/45 duty cycle for a typical SDRAM. Variations in layout, fabrication processes, operating temperatures and voltages, and the like, result in non-symmetrical delays among the DLL Delay Elements 12. All of these non-symmetrical delays produce output timing signals of the DLL exhibiting a difference between the duration of a high (tPHL) and low (tPLH) portion of the DLL output signal. As shown in FIG. 6, the high and low tPHL and tPLH signal portions, respectively, refer to the amount of time between transitions of the signal. If a signal remains high for a period longer than it stays low, then that signal is said to be asymmetric. On the other hand, if a signal is high and low for equal periods of time, then that signal is said to be symmetric.

Non-symmetrical delays also result in a skewed data eye and a larger difference 46 (FIG. 2) between the falling edge 44 of the XCLK signal 9 and the falling edge 42 of the DQ signal 25. In other words, as shown in FIG. 2, for an XCLK signal 9 having a 55/45 duty cycle, due to inconsistencies in the DLL delay elements 12 (FIG. 1), the DLLCLK 33 and DLLCLK* 37 signals may have a duty cycle of 40/60. Because it is the rising edge 30 of the DLLCLK signal 33 and the rising edge 34 of the DLLCLK* signal 37 from which the rising 28 and falling 42 edges, respectively, of the DQ signal 25 result, the non-symmetrical delays may result in a non-functional system. Furthermore, because the number of DLL Delay Elements used is cycle time dependent, the skew and difference 46 are also cycle time dependent. This unpredictable skew is undesirable for reliable high speed performance.

Therefore, there is a strong desire and need for synchronizing circuitry which compensates for the lack of symmetry in a signal synchronized by a delay-locked loop circuit with a system clock, thus enabling more reliable performance at high speeds.

SUMMARY OF THE INVENTION

The present invention provides a method and apparatus to compensate for skew and asymmetry of a locally processed system clock used to synchronize an output signal (e.g., a DQ data or DQS timing output signal) from a digital circuit, for example a memory device.

In its apparatus aspects the invention provides a first phase detector, an array of DLL delay elements and accompanying circuitry to phase-lock the rising edge of an output signal (e.g., DQ or DQS signal) with the rising edge of the system clock XCLK signal. Additionally, a comparator circuit, a register delay, an array of DLL delay elements and accompanying circuitry are provided to add or subtract delay from the falling edge of the output signal in order to produce a symmetrical output signal. The symmetrical output signal provides an improved timing margin for a given cycle time.

In its method aspects, the invention compares a processed system clock with a signal representative of an output signal (e.g., DQ or DQS signal) to adjust a setting of a delay circuit to phase-lock a rising edge of the output signal to a rising edge of an unprocessed system clock signal, producing a first delayed timing signal. A second delay circuit is adjusted according to asymmetries in a duty cycle of the first delayed timing signal, producing at least a second delayed timing signal. At least the first and second delayed timing signals are used to produce a substantially symmetrical output signal.

BRIEF DESCRIPTION OF THE DRAWINGS

These and other advantages and features of the invention will be more clearly understood from the following detailed description which is provided in connection with the accompanying drawings in which.

DETAILED DESCRIPTION OF THE PREFERRED EMBODIMENTS

For simplification, the invention will now be described with reference to synchronization of data output (DQ) from a memory device, it being understood that a memory device is not required, and that the invention applies to synchronizing the data output of any digital circuit which outputs data in a synchronized manner with reference to a system clock. In addition, the invention can also be used to produce a timing output signal DQS which is synchronized with a system clock.

Figure 1:
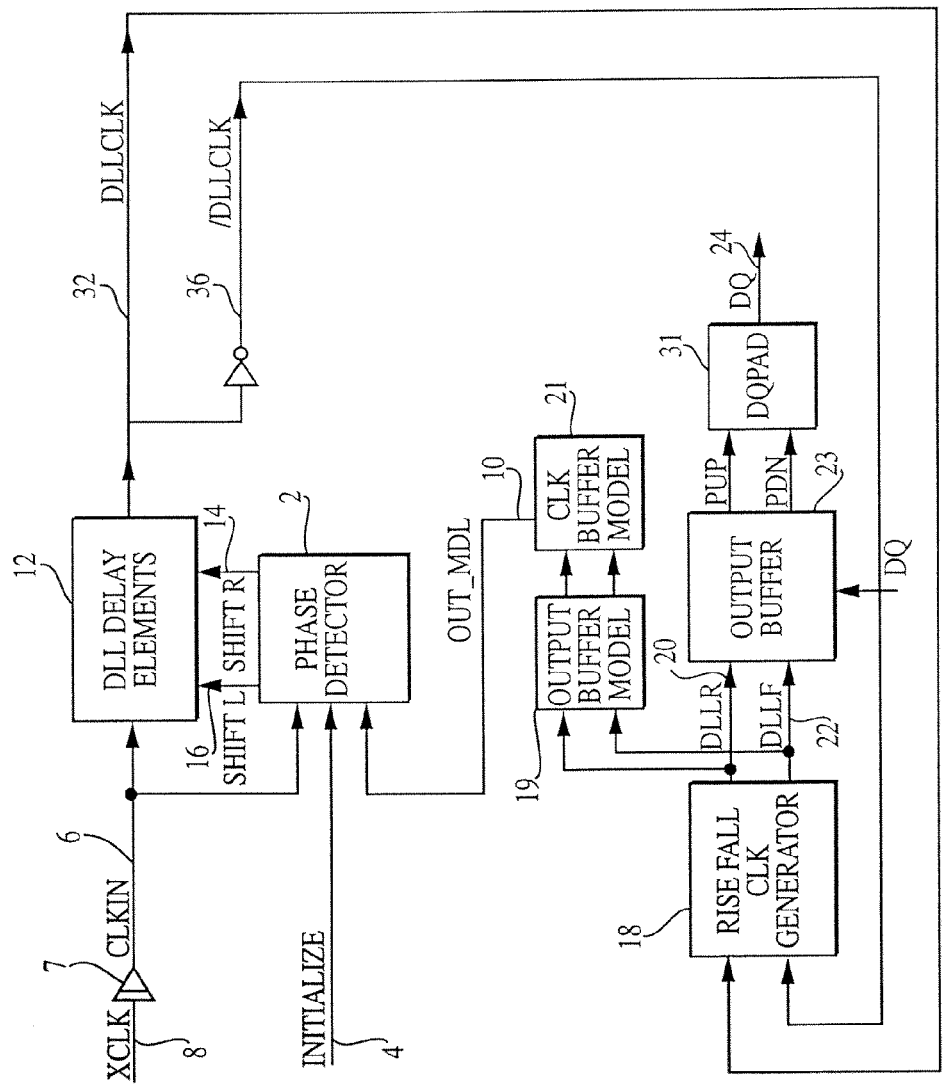
FIG. 1 illustrates a block diagram of a portion of a conventional circuit for generating a synchronizing data output signal.
Figure 2:
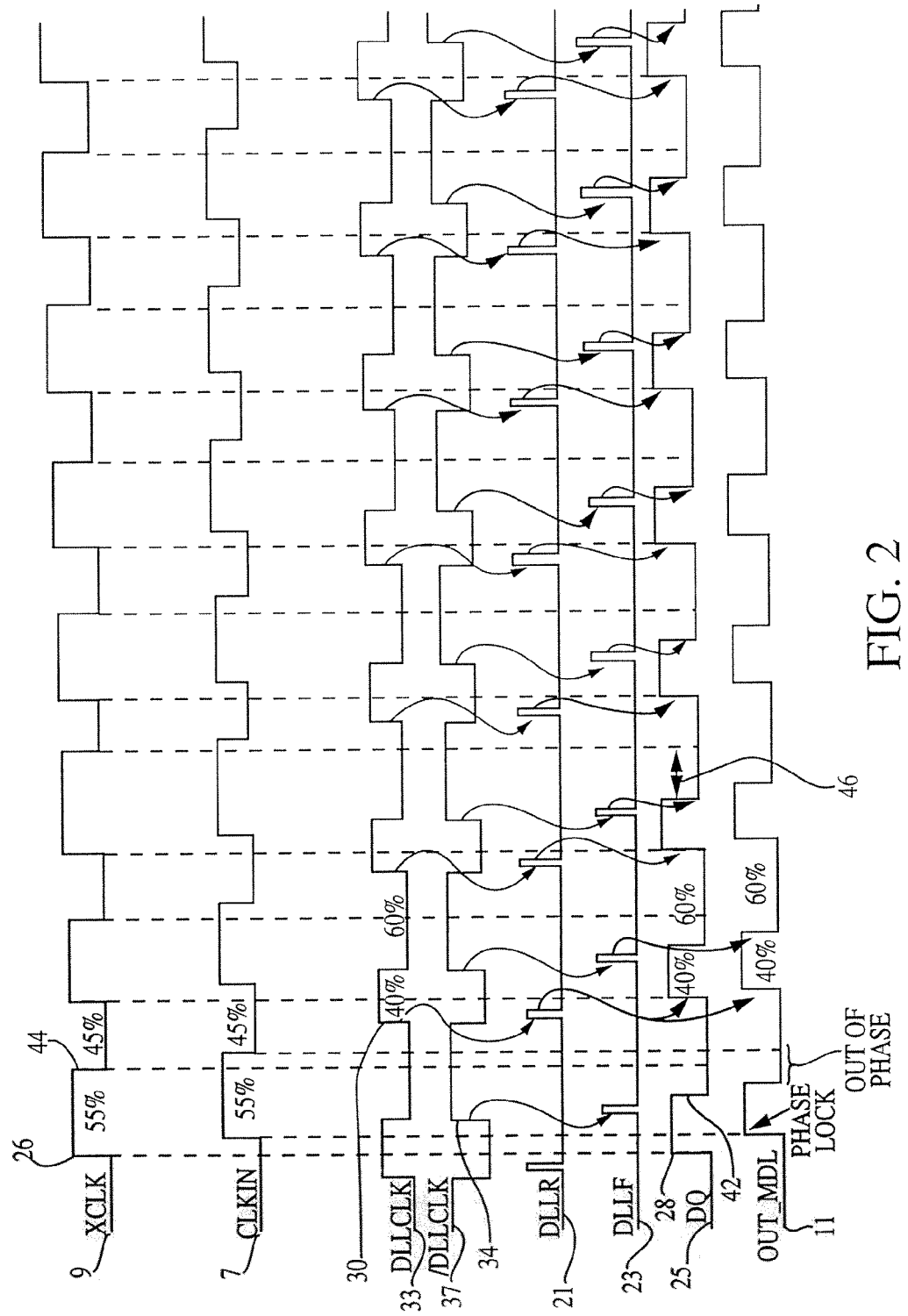
FIG. 2 illustrates a timing diagram for selected signals of FIG. 1.
Figure 3:
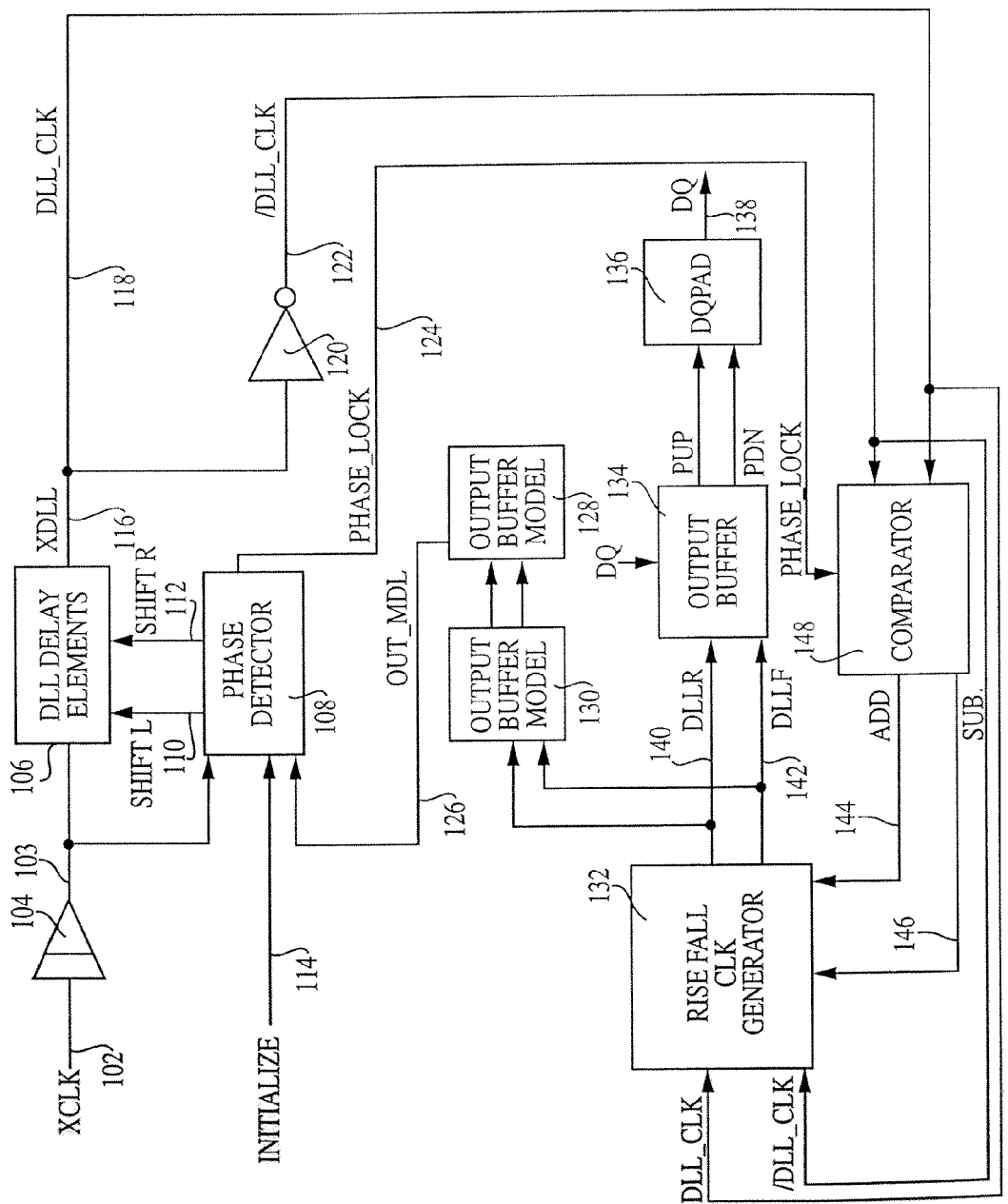
FIG. 3 illustrates a block diagram of a portion of a circuit for generating a synchronizing data output signal in accordance with the present invention.

FIG. 3 is a block diagram of an embodiment of a data synchronizing circuit according to the present invention. The embodiment in FIG. 3 includes a first phase detector 108 which, like phase detector 2 of FIG. 1, detects the relative phase between the CLKIN signal 103, a derivative of the system clock signal XCLK 102, and the OUT_MDL signal 126, which models the timing of the output buffer 134 which buffers and synchronizes the data output DQ signal 138. In response to a phase difference between the CLKIN signal 103 and the OUT_MDL signal 126, the first phase detector 108 adjusts the delay of DLL Delay Elements 106 to the CLKIN signal 103 by sending respective ShiftL 110 and ShiftR 112 signals to the DLL Delay Elements 106 to phase-lock the rising edges of the CLKIN 103 and OUT_MDL 126 signals. The Output Buffer Model 130 models the delays generated by the Output Buffer 134 and the CLK Buffer Model 128 models the delays generated by the Input Buffer 104 to produce an OUT_MDL signal 126 such that alignment of the OUT_MDL signal 126 with the CLKIN signal 103 will result in alignment of the XCLK signal 102 with the DQ signal 138. Phase-locking the rising edges of the CLKIN 103 and OUT_MDL 126 signals respectively causes the rising edges of the XCLK 602 and DQ 624 signals (FIG. 6) to align.

Once the first phase detector 108 has achieved a phase-lock, it outputs a phase-lock signal 124 to initiate operation of the comparator 148. The comparator 148 compares the relative time durations of the high tPLH and low tPHL portions of the DLLCLK signal 118 and the DLLCLK* signal 122, which is an inverted DLLCLK signal. In response to durational differences between tPLH and tPHL, the comparator 148 generates add and subtract signals 144, 146. The add and subtract signals 144, 146 are used in the Rise Fall CLK Generator 132 to control the amount of delay added to or subtracted from the DLLCLK* signal 122 prior to generation of the DLLF signal 142. The DLLR and DLLF signals 140, 142 are generated in the Rise Fall CLK Generator 132 to correspond to the rising edge of the DLLCLK and (delayed) DLLCLK* signals 118, 122, respectively, and are used in the Output Buffer 134 to produce the output data timing signal 138. As noted, the DLLR and DLLF signals 140, 142 are also used in the Output Buffer Model and CLK Buffer Model blocks 130, 128 to produce the OUT_MDL signal 126. The output data signal DQ on line 138 has both its rising and falling edges synchronized with the system clock XCLK 102.

Figure 4:
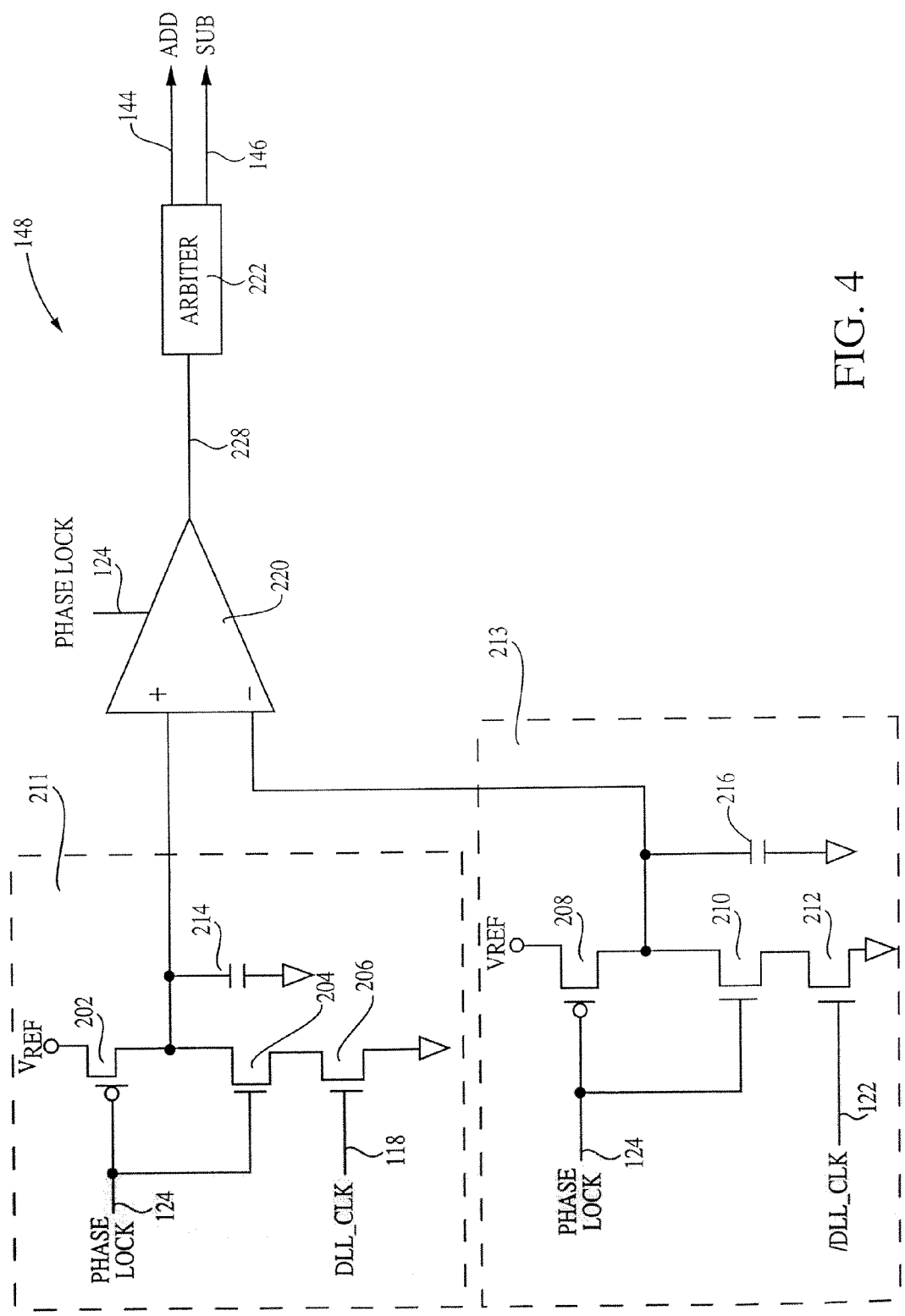
FIG. 4 illustrates a diagram of a portion of the circuit of FIG. 3.

FIG. 4 illustrates an exemplary embodiment of circuitry within the comparator 148. A first converter circuit 211 is connected between a reference voltage Vref and ground and includes two serially connected enabling transistors 202 and 204 and pull-down transistors 206. Transistor 202 is connected to Vref while transistor 206 is connected to ground. When transistor 202 is on, a capacitor 214 is connected between the reference voltage Vref and ground as shown in FIG. 4. The upper plate of the capacitor, connected to the reference voltage Vref, is also connected to a first input (+) of a comparison circuit 220. The gates of the enabling transistors 202 and 204 are controlled by the phase lock signal 124. The gate of the pull-down transistor 206 is controlled by the DLLCLK signal 118.

A second converter circuit 213 which is similar to converter circuit 211 is provided for a second input (−) of comparison circuit 220 as shown in FIG. 4. The second converter circuit 213 is of similar construction to that of converter 211, except its pull-down transistor 212 is controlled by the DLLCLK* signal 122. The upper plate of the capacitor 216 in the second converter circuit 213 is connected to a second input (−) of the comparison circuit 220. Comparison circuit 220 compares the differences between the output of the converter circuits 211, 213 for the DLLCLK and DLLCLK* signals 118, 122.

When the phase lock signal 124 is low, it will precharge capacitors 214 and 216 to Vref. When the phase lock signal 124 goes high to activate the gates of the enabling transistors 204, 210, the DLLCLK signal 118 controls the gate of the pull-down transistor 206 to selectively permit discharge of the capacitor 214 during the high time of the DLLCLK signal 118. Also, the DLLCLK* signal 122 controls the gate of the pull-down transistor 212 to selectively permit the discharge of the capacitor 216 during the high time of the DLLCLK* signal 122. Because the DLLCLK* and DLLCLK signals 122, 118 are inverted and non-inverted versions of the same clock signal, the comparison circuit 220 is able to generate an error signal 228 corresponding to the lack of symmetry in the output of the DLL delay elements 106.

For example, if the ratio of high tPLH to the low tPHL portion of the DLL output is 60/40, then the comparison circuit 220 may generate an error signal 228 of appropriate polarity during the cycle which reflects the duration of the asymmetry, or 10% of the clock cycle in this example.

The error signal 228 is translated in the arbiter block 222 into two signals, the add signal 144 and the subtract signal 146. The add and subtract signals 144, 146 represent delay that may be added or subtracted, respectively, with respect to the timing of the falling edge of an output data signal 138 in order to achieve symmetry. The timing of the output data signal is determined in the Rise Fall CLK Generator 132 (FIG. 3). An example of using the add and subtract signals 144 and 146 in the Rise Fall CLK Generator 132 is illustrated in FIG. 5.

Figure 5:
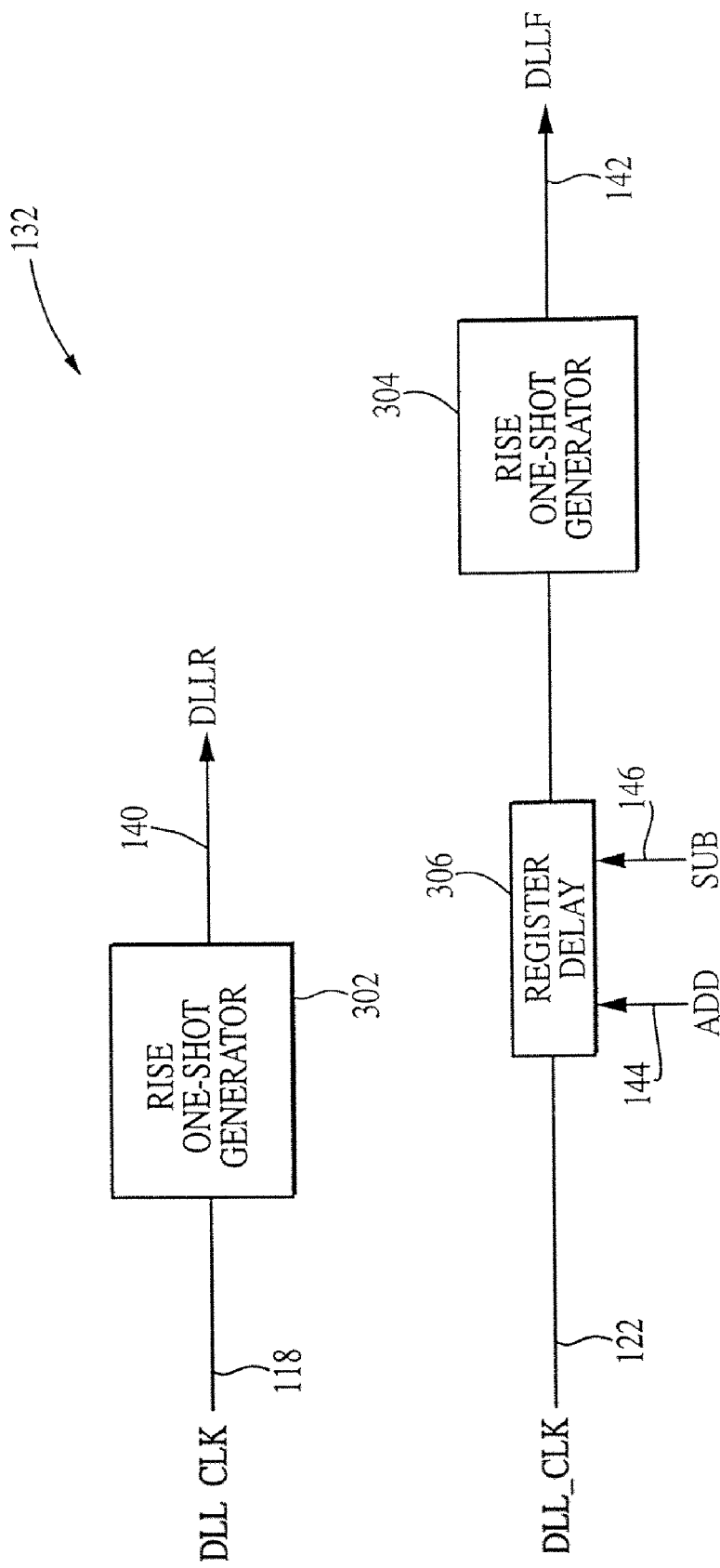
FIG. 5 illustrates a block diagram of another portion of the circuit of FIG. 3.

FIG. 5 shows an exemplary Rise Fall CLK Generator 132. Each of the signals DLLR 140 and DLLF 142 are generated by passing the internal DLL clock signals DLLCLK and DLLCLK* 118 and 122, respectively, through a Rise One-Shot Generator 302, 304, which generates a high pulse of short duration when it receives a transition from low to high. The DLLR and DLLF signals 140, 142 are used to control the rising and falling of the output data signal 138 (FIG. 3).

As shown in FIG. 5, a Register Delay 306 is used in the DLLF data path upstream of the DLLF Rise One-Shot Generator 304. The add and subtract signals 144, 146 control the amount of delay added to or subtracted from the DLLCLK* signal 122 before the DLLF signal 142 is generated in the DLLF Rise One-Shot Generator 304. In this way, the DLLF signal 142, and hence the falling edge of the output data signal 138, can be delayed an amount necessary to make the high tPHL and low tPLH portions of the DLL output signal substantially equal or within an allowed tolerance of each other. In other words, the output data signal 138 has a substantially symmetric duty cycle.

It should be readily understood that FIG. 5 illustrates merely one example of a Rise Fall CLK Generator 132. Use of the Register Delay 306 in the DLLF data path is not required and it should be readily understood that a different delay circuit may be used in the DLLR data path with appropriate modifications to associated circuitry to achieve the same result. Alternatively, delay circuits may be used in both the DLLF and DLLR data paths with appropriate modifications to associated circuitry to achieve the same result. Also, the use of a Register Delay 306 is not required and other circuit elements may be used for timing synchronization as is well known in the art.

Figure 6:
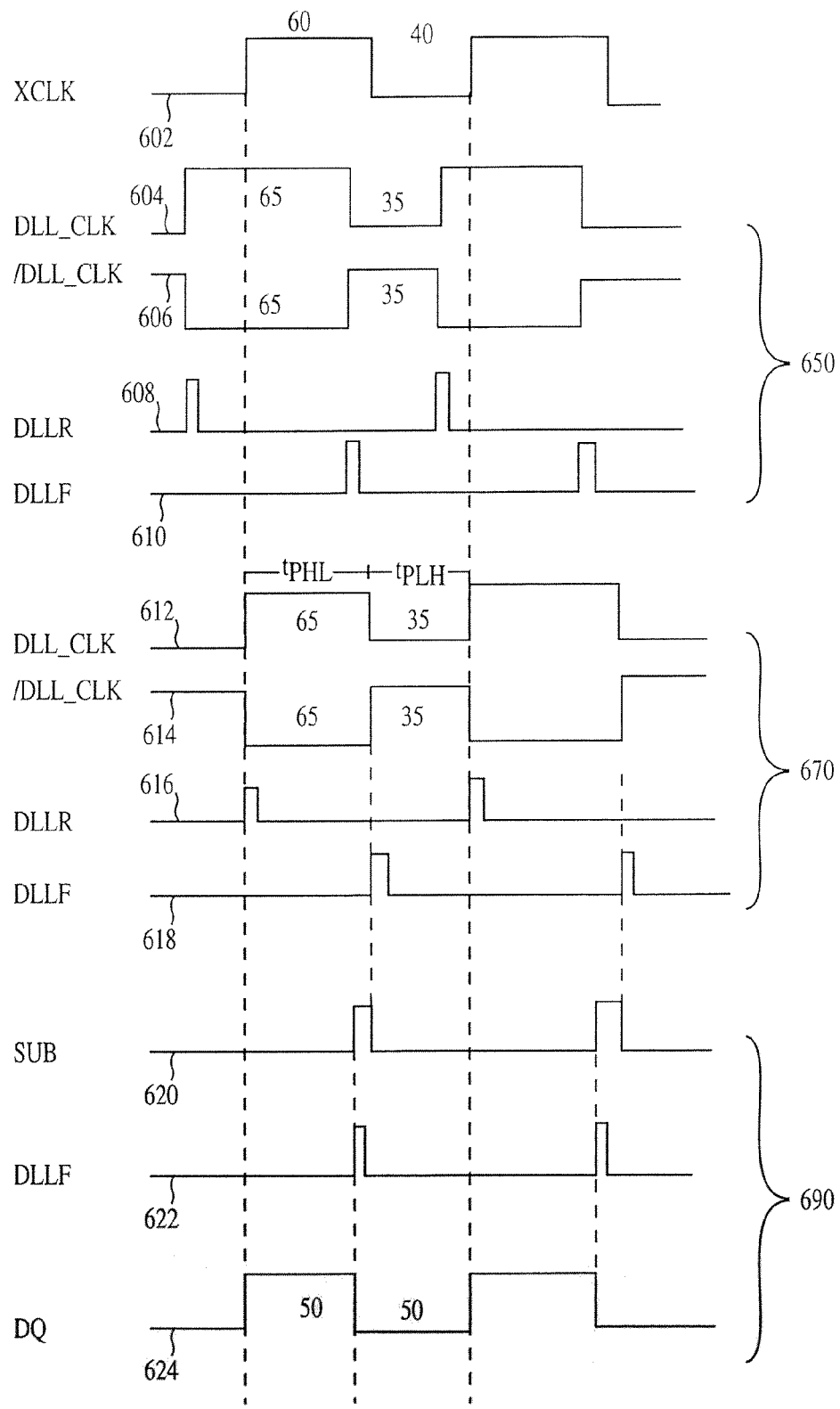
FIG. 6 illustrates a timing diagram for selected signals of FIG. 3.

As demonstrated in the exemplary timing diagram of FIG. 6, by adjusting the delay of the DLLF signal 622, the output data DQ 624 can be generated with a 50/50 ratio (duty cycle). For example, in FIG. 6 the system clock XCLK 602 is shown with a 60/40 ratio of high tPLH to low tPHL signal portions. Due to delays added by the DLL Delay Elements 106, the DLLCLK and DLLCLK* signals 604, 606 have a 65/35 ratio.

As shown in the first timing sequence 650, prior to phase lock or any compensation using the circuitry of the invention, the DLLCLK and DLLCLK* signals 604, 606 may produce corresponding DLLR and DLLF signals 608, 610, having a duty cycle not substantially equal to 50/50 and not in phase with the system clock XCLK signal 602.

The second timing sequence 670 is produced after the phase-locking is completed by phase detector 108, but before the operation of the comparator 148. This second sequence 670 shows signals DLLR and DLLF signals 616, 618 generated in phase with the rising edge of the system clock XCLK 602, but still having the asymmetric duty cycle of the system clock and further exacerbated by the DLL Delay Elements 106.

Finally, the third timing sequence 690 is produced using the comparator 148 and accompanying adjustment of the timing of the DLLF signal 142. The subtract signal 620 is generated in the arbiter block 222 of the comparator 148 (FIG. 4) and used to adjust the Register Delay 306 in the Rise Fall CLK Generator 132 (FIG. 5), thereby adjusting the timing of the DLLF signal 622, as shown in FIG. 6. The resulting output data signal 624 has an acceptable ratio of high tPLH to low tPHL signal portions and thus exhibits a substantially symmetric 50/50 duty cycle, The symmetric quality of the output data signal 624 permits improvement of the timing budget by maximizing the data eye used for synchronization of data output.

Thus, in reference to FIGS. 3-6, to produce a symmetric data output signal DQ 138 having a rising edge aligned with the rising edge of the XCLK 102, a phase detector 108, comparator 148 and Rise Fall CLK Generator 132 are used to separately initiate rising and falling edges of the DQ signal 138. When a system clock signal XCLK 102 is received, it is processed and compared with a signal representative of the timing of a DQ signal 138. The processed system clock signal CLKIN 103 is delayed by DLL Delay Elements 106 controlled by a phase detector 108 to produce a delayed system clock signal DLLCLK 118. The inverse of the delayed system clock signal DLLCLK* 122 is then further delayed by a Register Delay 306 under the control of a comparator 148. In this way, the rising edge of the system clock signal XCLK 102 may be aligned (phase locked) with the rising edge of the data output signal DQ 138 and the data output signal DQ 138 may be generated so that it is symmetric.

Figure 7:
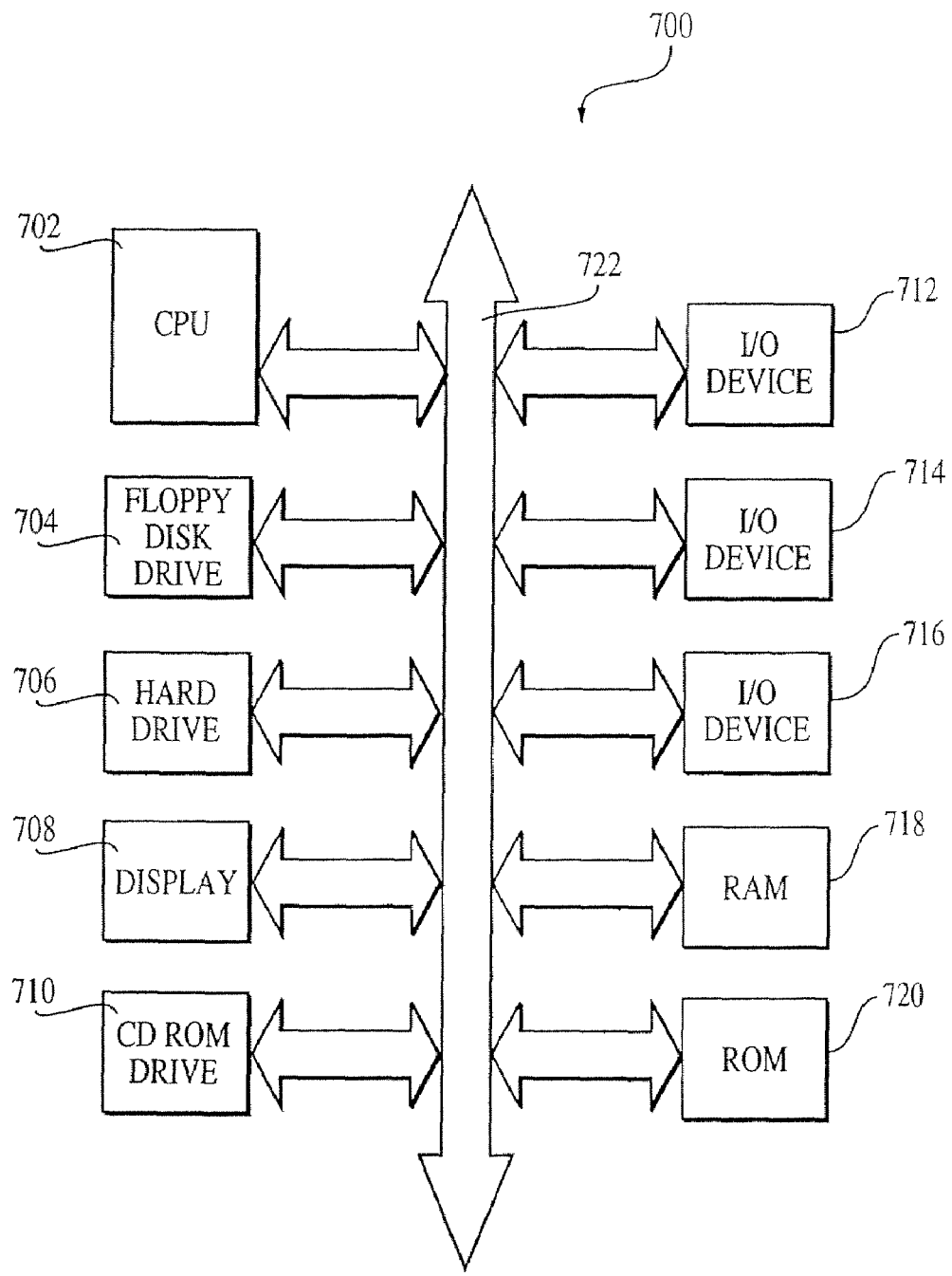
FIG. 7 illustrates a processor system employing a method and apparatus of the present invention.

FIG. 7 illustrates a processor system which employs logic circuits and selection methodologies in accordance with the method and apparatus of the invention.

As shown in FIG. 7, a processor based system, such as a computer system 700, for example, generally comprises a central processing unit (CPU) 702, for example, a microprocessor, that communicates with one or more input/output (I/O) devices 712, 714, 716 over a system bus 722. The computer system 700 also includes random access memory (RAM) 718, a read only memory (ROM) 720 and, in the case of a computer system may include peripheral devices such as a floppy disk drive 704, a hard drive 706, a display 708 and a compact disk (CD) ROM drive 710 which also communicate with the processor 702 over the bus 722. The RAM 718 is preferably constructed with delay-lock loop (DLL) circuitry for synchronizing the data output of the memory devices with a system clock using the method and apparatus of the invention described above with reference to FIGS. 3-6. It should be noted that FIG. 7 is merely representative of many different types of processor system architectures which may employ the invention.

Figure 8:
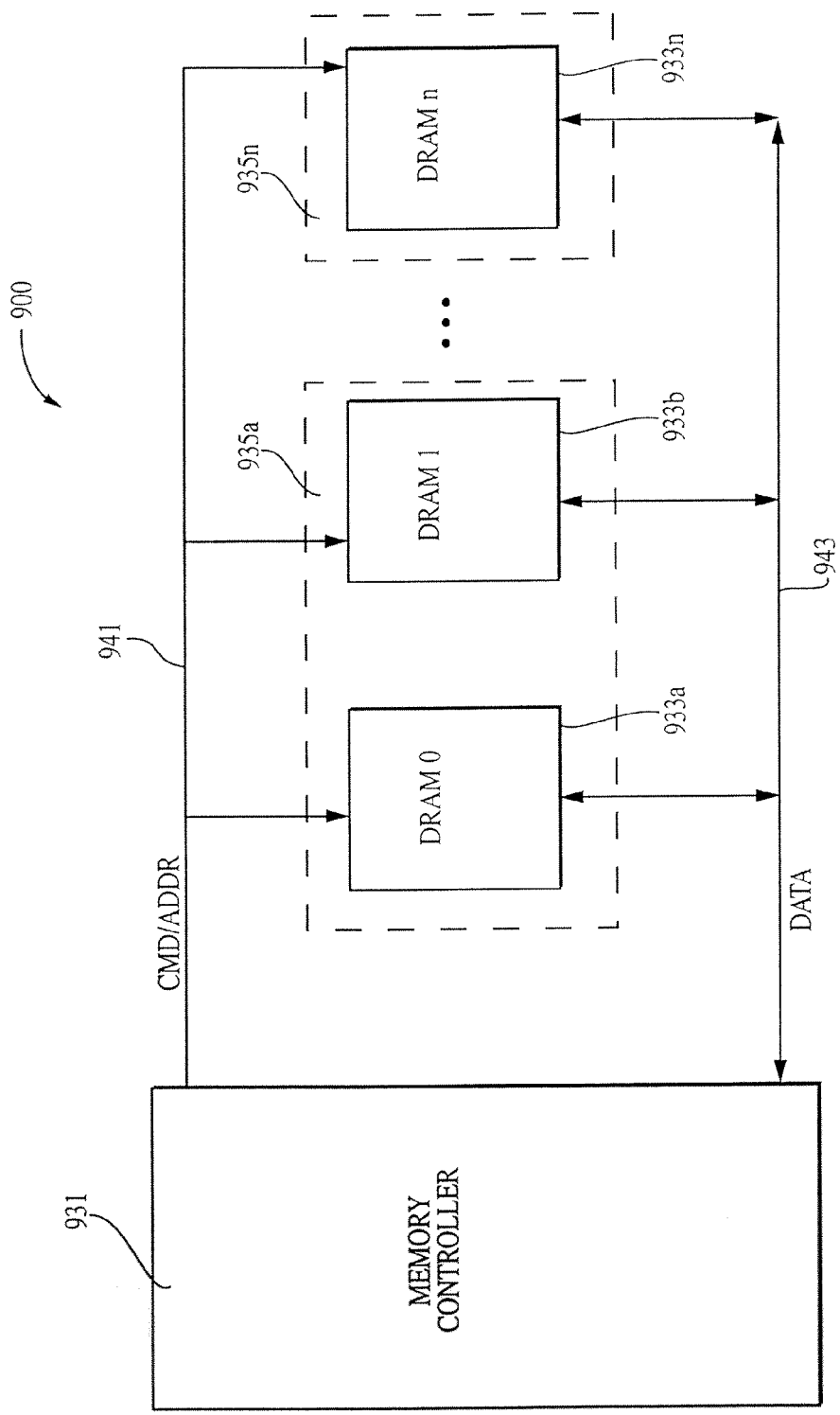
FIG. 8 illustrates a partial block diagram of a memory system constructed in accordance with an embodiment of the invention.
Figure 9:
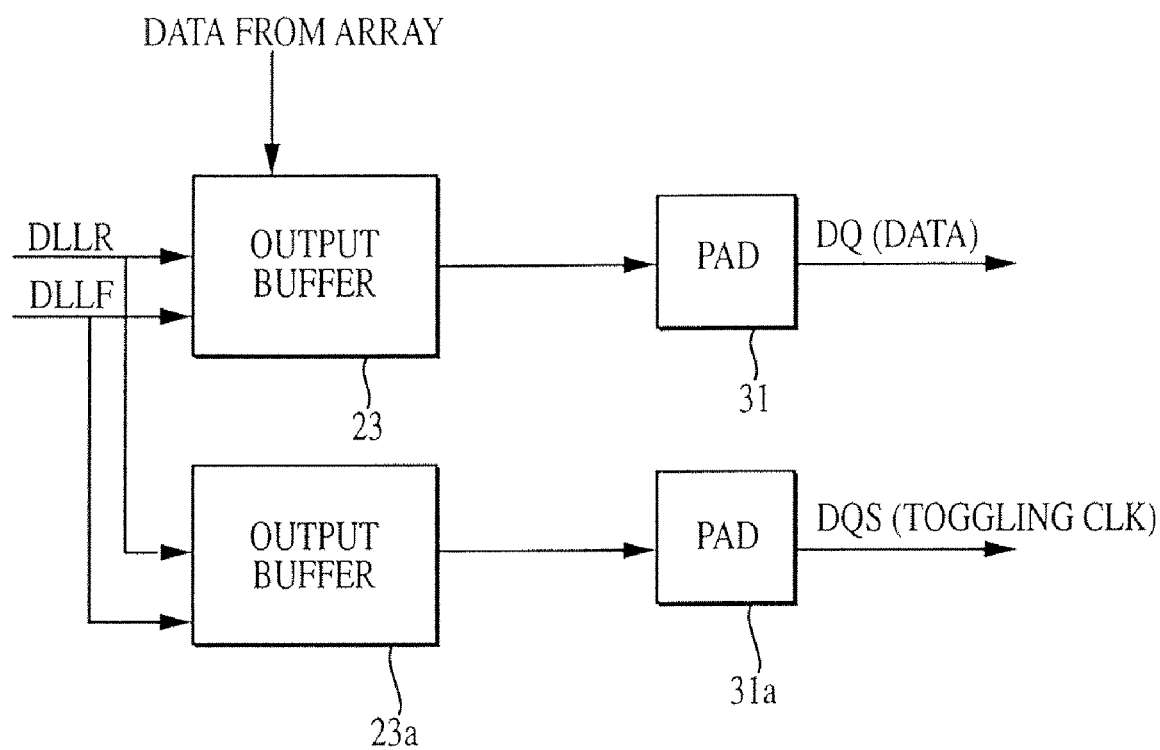
FIG. 9 illustrates a variation of the FIG. 1 circuit.

As illustrated in FIG. 8, in another embodiment of the invention, a memory system 900 is provided including at least one or a plurality of memory devices 933 constructed with delay-lock loop (DLL) circuitry which can be used to synchronize the data output of the memory devices 933 with a system clock using the method and apparatus of the invention described above with reference to FIGS. 3-6. Within the memory system 900, some or all of the plurality of memory devices 933 may be arranged on at least one memory module 935. In a preferred configuration, the memory system 900 would include a plurality of memory modules 935, each containing at least one or a plurality of memory devices 933 constructed with the synchronizing circuitry as described above with reference to FIGS. 3-6.

While the invention has been described and illustrated with reference to specific exemplary embodiments, it should be understood that many modifications and substitutions can be made without departing from the spirit and scope of the invention. Accordingly, the invention is not to be considered as limited by the foregoing description but is only limited by the scope of the appended claims.

The invention claimed is:

1. A method of synchronizing an output signal with a first clock signal, said method comprising:
    deriving a local clock signal from the first clock signal;
    producing a delayed clock signal from the local clock signal;
    producing first and second timing signals, each associated with one of a rising and falling edge of the delayed clock signal;
    adjusting a relative timing of one of the first and second timing signals to produce substantially equal time durations between occurrences of the first and second timing signals; and
    generating the output signal having a rising edge synchronized with a rising edge of the first clock signal in response to the first and second timing signals.

2. The method of claim 1, wherein the output signal is generated with a substantially symmetric duty cycle.

3. The method of claim 1, further comprising detecting a difference in phase between the local clock signal derived from the first clock signal and a signal representative of the output signal.

4. The method of claim 1, further comprising measuring a difference between a low time of the delayed clock signal and a low time of an inverse of the delayed clock signal.

5. The mod of claim 1, further comprising measuring a difference between a high time of the delayed clock signal and a high time of an inverse of the delayed clock signal.

6. The method of claim 5, further comprising generating at least two adjustment signals from an error signal based on the measuring step, the adjustment signals being used to produce at least one of the first and second timing signals.

7. The method of claim 1, further comprising:
    delaying the delayed clock signal by a fixed number of delays; and
    delaying the second timing signal by a variable number of delays.

8. A method of synchronizing an output signal with a first clock signal, said method comprising:
    deriving a local clock signal from the first clock signal;
    producing a delayed clock signal from a local clock signal;
    comparing a first delay characteristic associated with the delayed clock signal with a second delay characteristic associated with an inverse of the delayed clock signal;
    generating a first one-shot timing signal from the delayed clock signal and a second one-shot timing signal from an adjustably delayed signal associated with the inverse of the delayed clock signal;
    adjusting the adjustably delayed signal to produce substantially equal time durations between occurrences of the first and second one-shot timing signals; and
    generating the output signal from the first and second one-shot timing signals.

9. The method of claim 8, wherein the output signal is generated having a substantially symmetric duty cycle.

10. The method of claim 8, wherein the first delay characteristic is a low time of the delayed clock signal and the second delay characteristic is a high time of the inverse of the delayed clock signal.

11. The method of claim 8, wherein the first delay characteristic is a high time of the delayed clock signal and the second delay characteristic is a high time of the inverse of the delayed clock signal.

12. A memory system comprising:
- a synchronization circuit, the synchronization circuit comprising:
- a first circuit configured to produce a first timing signal based on phase-locking a first edge of an output signal to a first edge of a first clock signal and to produce a second timing signal based on a duty cycle of a delayed first clock signal; and
- a second circuit configured to use the first and second timing signals to output the output signal synchronized with the first clock signal and having a substantially symmetrical duty cycle.

13. The system of claim 12, wherein the second circuit is configured to output the output signal by generating a rising edge of the output signal in response to the first timing signal and generating a falling edge of the output signal in response to the second timing signal.

14. The system of claim 12, wherein the second circuit is configured to output the output signal by generating a rising edge of the output signal in response to the second timing signal and generating a falling edge of the output signal in response to the first timing signal.

15. The system of claim 12, wherein the first circuit comprises:
- a comparator configured to compare a signal representative of the output signal with a local clock signal derived from the first clock signal; and
- a clock generator configured to generate the delayed clock signal in response to a phase difference between the local clock signal and the signal representative of the output signal.

16. The system of claim 12, wherein the output signal is a strobe signal.

17. The system of claim 12, wherein the output signal is a data signal.

* * * * *

UNITED STATES PATENT AND TRADEMARK OFFICE
CERTIFICATE OF CORRECTION

PATENT NO. : 7,421,607 B2  Page 1 of 1
APPLICATION NO. : 11/751182
DATED : September 2, 2008
INVENTOR(S) : Li et al.

It is certified that error appears in the above-identified patent and that said Letters Patent is hereby corrected as shown below:

In column 8, line 37, in Claim 5, delete "mod" and insert -- method --, therefor.

Signed and Sealed this

Fourth Day of November, 2008

JON W. DUDAS
*Director of the United States Patent and Trademark Office*